United States Patent [19]

Isaac et al.

[11] Patent Number: 5,557,212
[45] Date of Patent: Sep. 17, 1996

[54] SEMICONDUCTOR TEST SOCKET AND CONTACTS

[76] Inventors: George L. Isaac, 980 Kiely Blvd. #326, Santa Clara, Calif. 95051; Donald C. Miller, 1139 Blair Ave., Sunnyvale, Calif. 94087; Rodney S. Ziegenhagen, II, 2905 Kilo Ave., San Jose, Calif. 95124

[21] Appl. No.: 342,171

[22] Filed: Nov. 18, 1994

[51] Int. Cl.⁶ .......................... G01R 1/073; G01R 31/02
[52] U.S. Cl. ........................................ 324/755; 439/72
[58] Field of Search ............................ 324/755, 758, 324/761, 754; 439/70, 72, 73

[56] References Cited

U.S. PATENT DOCUMENTS

| | | | |
|---|---|---|---|
| 3,377,514 | 4/1968 | Ruehlemann et al. | 439/68 |
| 3,391,383 | 7/1968 | Antes | 324/158.1 |
| 4,560,216 | 12/1985 | Egawa | 324/755 |
| 4,649,339 | 3/1987 | Grangroth et al. | 324/72.5 |
| 4,733,172 | 3/1988 | Smolley | 324/754 |
| 5,087,877 | 2/1992 | Frentz et al. | 324/760 |
| 5,172,049 | 12/1992 | Kiyokawa et al. | 324/755 |
| 5,313,157 | 5/1994 | Pasiecznik, Jr. | 324/757 |
| 5,444,388 | 8/1995 | Ideta et al. | 324/755 |

*Primary Examiner*—Ernest F. Karlsen

[57] ABSTRACT

A semiconductor device test socket is disclosed which includes one or more flexible replaceable shielded solderless multiple contact assemblies. The multiple contact assemblies provide electrical communication between a semiconductor device under test and a semiconductor device test circuit. The semiconductor device has a plurality of accessible terminals contacted by the multiple contact assemblies and is held in an insulating device carrier which also serves to protect the device terminals from damage during insertion of the device into the test socket. The carrier is secured in a test socket base by a releasable latch for testing over a period of time and/or in controlled environments.

9 Claims, 2 Drawing Sheets

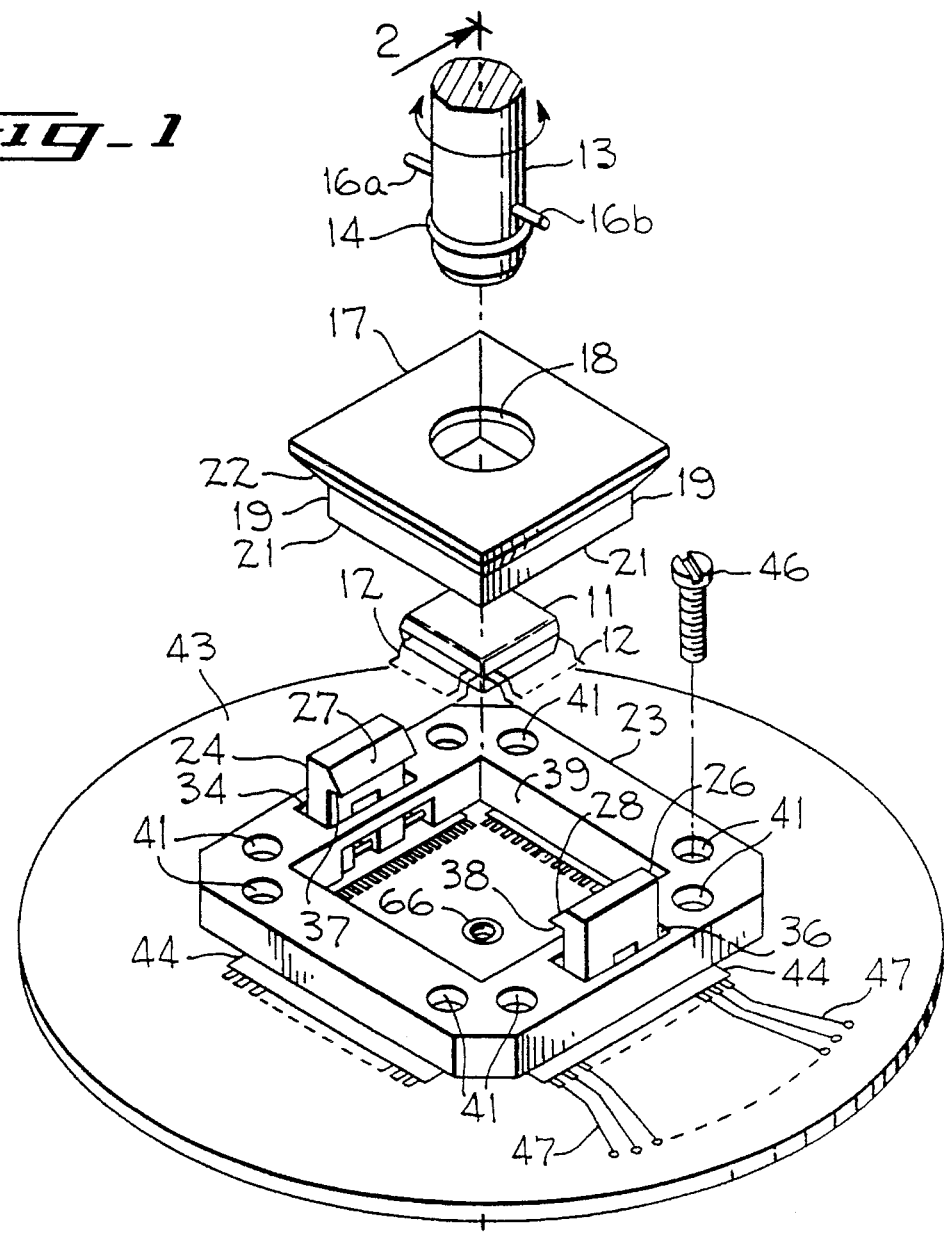
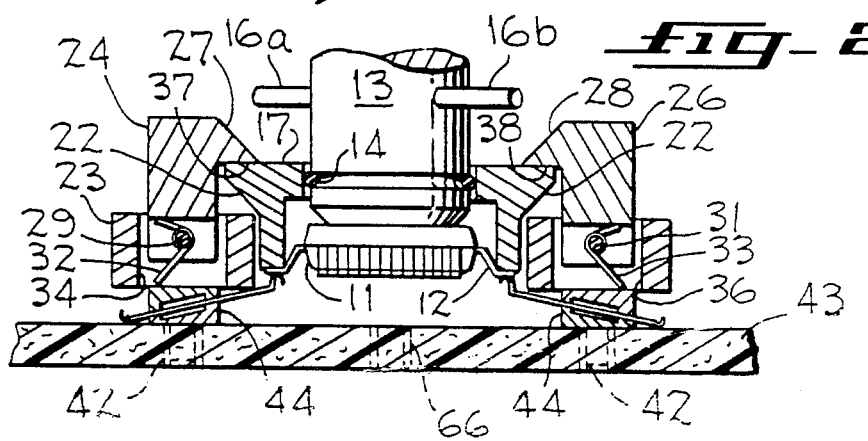

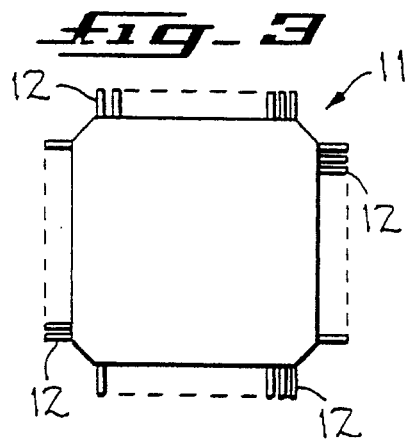
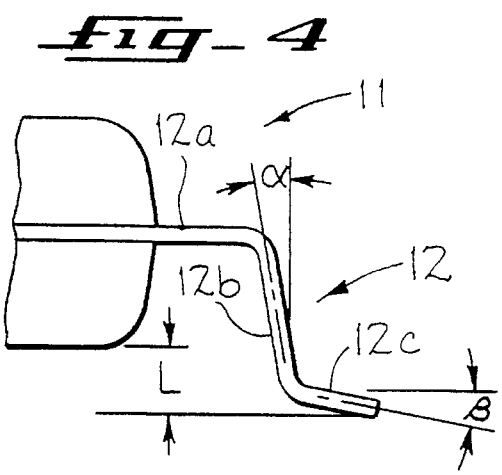
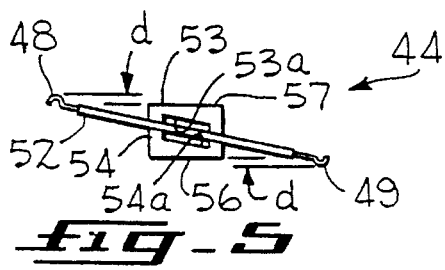
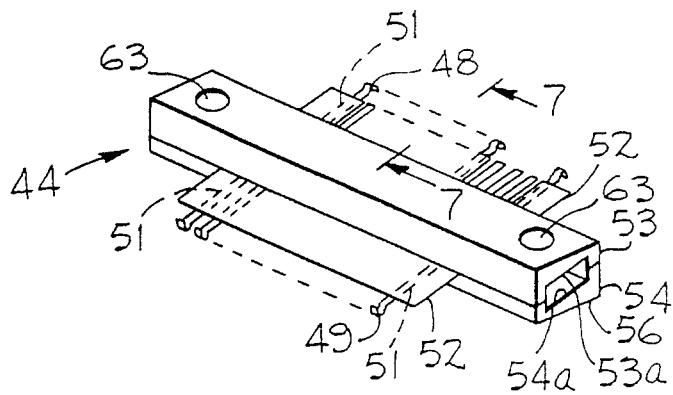
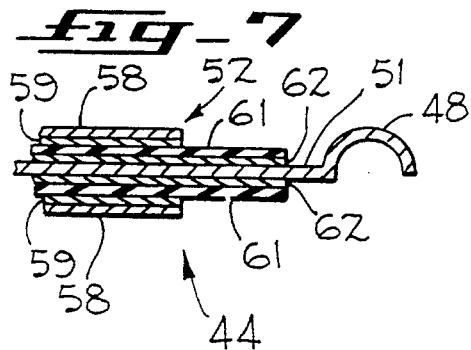
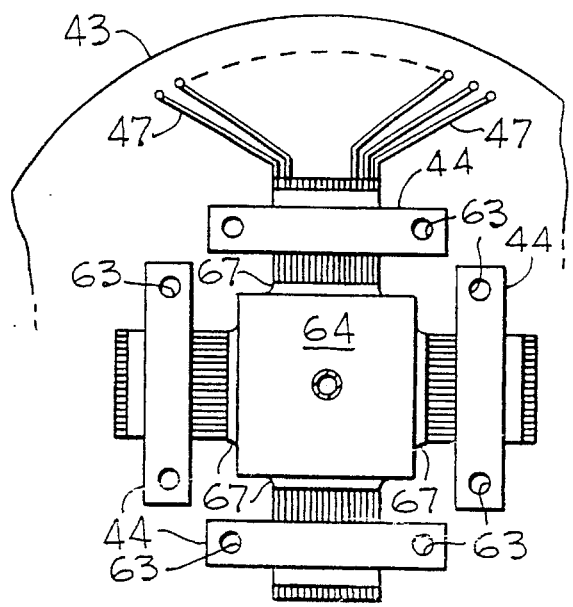

SEMICONDUCTOR TEST SOCKET AND CONTACTS

SUMMARY OF THE INVENTION

A semiconductor test socket is secured to a test board having a pattern of contact pads formed thereon to communicate with a predetermined pattern of accessible contacts on a semiconductor device under test. The device under test is transported to the test socket by a semiconductor holder. The test socket includes insulator carrier means adapted to be accepted by the semiconductor holder and to surround a semiconductor device therewithin. Means is provided on the insulator carrier means for mechanically supporting the predetermined pattern of accessible contacts on the semiconductor device. A test socket base receives the insulator carrier means and latching means is provided for holding the insulator carrier means in place within the test socket base during testing and for thereafter releasing the insulator carrier means. Contact means is disposed between the test socket base and the test board, having opposed upper and lower contact sides thereon. The lower contact side has a plurality of electrical contacts arranged in registration with the test board pattern of contacts. The upper contact side has a plurality of electrical contacts in electrical communication with ones of the lower contact side plurality of contacts, further being arranged in registration with the predetermined pattern of accessible contacts on the semiconductor device undergoing test.

In another aspect of the invention a semiconductor test socket apparatus is provided for attachment to a semiconductor test board for use in testing a semiconductor device having a predetermined pattern of accessible device terminals. The test socket apparatus includes a pattern of contact pads formed on the semiconductor test board and a test socket base disposed above the pattern of contact pads. Semiconductor device positioning means is provided for locating the semiconductor device in the socket base. Solderless contact means is positioned between the test socket base and the semiconductor test board, having a plurality of solderless lower contacts arranged in registration with the pattern of contact pads and further having a plurality of solderless upper contacts in electrical communication with ones of the plurality of lower contacts. The plurality of solderless upper contacts is arranged in registration with the predetermined pattern of accessible device terminals. Means is provided for fixing the test socket base and the solderless contact means to the semiconductor test board.

Yet another aspect of the invention relates to a solderless contact array for use in contacting an array of accessible semiconductor device terminals for providing electrical contact between the device terminals and a pattern of conducting pads in electrical communication with a semiconductor device test circuit. The contact array includes a plurality of upper contacts arranged in registration with the array of accessible semiconductor device terminals. Further, a plurality of lower contacts is arranged in registration with the pattern of contacting pads. A plurality of conductor paths extend between ones of the plurality of upper and lower contacts. An upper electrical shield overlies the plurality of conducting paths and a lower electrical shield underlies the plurality of conducting paths. Insulation means is disposed between and affixed to the upper electrical shield and the plurality of conducting paths and also between and affixed to the lower electrical shield and the plurality of conductor paths. Holding means is provided surrounding the upper and lower electrical shields in orientation when mounted on the semiconductor test board so that the plurality of conducting paths extend from and are in electrical communication with ones of the pattern of conducting pads.

BRIEF DESCRIPTION OF THE DRAWINGS

FIG. 1 is an exploded perspective view of the semiconductor device test socket of the present invention.

FIG. 2 is a section along the line 2—2 of FIG. 1.

FIG. 3 is a plan view of one type of semiconductor device to be tested by the present invention.

FIG. 4 is a detail of the semiconductor device of FIG. 3 showing the accessible contacts on the semiconductor as device.

FIG. 5 is an elevation of the solderless contact array used in the present invention.

FIG. 6 is a perspective view of the array of FIG. 5.

FIG. 7 is a view along the line 7—7 of FIG. 6.

FIG. 8 is a plan view showing assembly of a plurality of solderless contact arrays on a PC board.

DESCRIPTION OF THE PREFERRED EMBODIMENTS

Currently there is a need for handling semiconductor packages having a large number of accessible contacts extending from the semiconductor packages wherein the accessible contacts are fabricated from light and fragile material. Handling of such semiconductor devices or packages is necessary at the site of device manufacture because such packages must be tested as soon as possible after device fabrication to determine the integrity of the semiconductor device contained circuits and circuit components. It is important economically to determine the usefulness of the semiconductor device early, before the performance of subsequent expensive operations such as packaging, marking, etc.

Semiconductor packages or devices may have accessible terminals or contacts on all four sides of a rectangular package, or on a fewer number of sides. This description will describe a semiconductor device test socket and the solderless contacts contained in the test socket, wherein the test socket is capable of testing a semiconductor device with a plurality of accessible contacts extending from each of the four sides of a rectangular package. It is understood that the invention described herein is useful for semiconductor packages having accessible contacts extending from fewer than four sides thereof and for semiconductor packages varying in shape in plan view from the somewhat square or rectangular semiconductor package to be tested in this description of a preferred embodiment of the invention.

FIG. 3 shows a plan view of a semiconductor device 11 which may be tested by the test socket described herein, wherein a plurality of accessible device contacts 12 extend from each of the four sides thereof.

FIG. 4 is a detail in elevation of one of the four edges of the semiconductor device 11. One of the accessible contacts 12 having a portion 12a extending outwardly from the semiconductor device in a plane parallel to the plane containing the length and width dimensions of the device seen in FIG. 3. Further, FIG. 4 shows the accessible terminal 12 having a portion 12b extending downwardly at an angle $\alpha$ to the vertical in FIG. 4. A third portion 12c of the accessible contact 12 is formed to extend outwardly away from the semiconductor device 11 at an angle $\beta$ below the horizontal in FIG. 4. The accessible contact 12 just described in conjunction with FIG. 4 is termed a "gull wing" contact extending from the semiconductor package 11. It should be noted that the portion of the gull wing contact 12 represented by item no. 12c extends below the lower surface of the semiconductor device by a dimension L as seen in FIG. 4. The extension of the gull wing contact 12 below the lower surface of device 11 is for the purpose of allowing the semiconductor device to be placed in a final assembly on a predetermined array of contact pads on a circuit board while assuring that none of the contacts 12 are held off of the circuit board by the lower surface of the semiconductor package 11.

With reference now to FIG. 1 of the drawings an exploded view of the semiconductor device test socket and contacts is shown. A "pick and place" tool 13, of a conventional type, has a resilient O-ring seal 14 near the lower end thereof. The "pick and place" tool is designed to be placed on top of a semiconductor package, a vacuum is then applied through passages in the tool to force the semiconductor package tightly against the lower end of the "pick and place" tool so that the semiconductor package may be transported by the tool from one position to another. A pair of protuberances, such as the pins 16a and 16b, extend from opposing sides of the "pick and place" tool for unlatching purposes which will be hereinafter described. The "pick and place" tool 13 is round in cross section.

A semiconductor carrier 17 is formed of an insulation material such as Delrin (TM). The carrier has a hole 18 therethrough for receiving the lower portion of the "pick and place" tool 13. When the "pick and place" tool is extended through the hole 18 the semiconductor device package 11 is engaged thereby, as hereinbefore described, and held firmly within the carrier 17 by the vacuum applied to the tool 13. The seal 14 engages the edges of the hole 18 so that the low pressure created within the carrier by the aforementioned vacuum holds the semiconductor device 11 firmly within the carrier. The seal provided by the O-ring is not necessarily leak proof. There is a depending skirt 19 running around the carrier 17 having a lower edge 21 on each side of the skin which engages and mechanically "backs up" the portion 12c (FIG. 4) of the gull wing contacts 12 (FIGS. 3 and 4) on the semiconductor device 11.

The semiconductor device carrier 17 also has an angled surface 22 at each edge thereof extending from the upper surface of the carrier downwardly to intersect the depending skirts 19 on each side thereof. When the "pick and place" tool 13 is inserted through the hole 18 to engage a semiconductor device 11 within the carrier 17, it is lowered toward a test socket base 23. A pair of spring loaded rotating latches 24 and 26 are assembled in the test socket base in a position so that the angled surface 22 on the carrier 17 bears against angled surfaces 27 and 28 on the spring loaded rotating latches 24 and. 26 respectively. Continued lowering of the "pick and place" tool 13 causes the latches 24 and 26 to be cammed outwardly and to rotate about a support pin 29 for latch 24 and a support pin 31 for latch 26. The latches are spring loaded inwardly about the support pins 29 and 31 by a pair of coil springs 32 and 33 surrounding support pins 29 and 31 respectively as seen in FIG. 2. The latches 24 and. 26 have room for limited rotation about pins 29 and 31 within a pair of through cuts 34 and 36 in base 23. When the "pick and place" tool 13 is lowered sufficiently for the upper surface of the semiconductor package carrier 17 to pass by the surfaces 27 and 28 on the latches 24 and 26, the springs 32 and 38 force the latches inwardly to engage the upper surface of the carrier 17 on opposing sides thereof with a lip 37 and a lip 38 which may be seen in both FIGS. 1 and 2.

In this latter described position the "pick and place" tool 13 has positioned a semiconductor package 11 within a central cut out 39 in the base 23 with the lower edge 21 on the depending skirt 19 of the carrier 17 physically backing up the portions at 12c (FIG. 4) of the gull wing contacts 12 (FIGS. 3 and 4) so that the contacts 12 cannot be bent upwardly beyond their elastic limit. The gull wing contacts 12 are therefore maintained in alignment so that the lower portions 12c thereof (FIG. 4) are substantially coplanar and maintained substantially at the dimension L (FIG. 4) during and after testing of the semiconductor package 11.

A set of eight counterbored holes 41 are formed through the test socket base 23 which allow screws 46 to pass therethrough. A pattern of threaded inserts 42 is provided in a supporting printed circuit board 43 wherein the pattern of threaded inserts is in registration with the pattern of counterbored holes 41. A group of four solderless flexible contact sets 44 is provided between the printed circuit board 43 and the lower surface of the test socket base 23. Each of the four contact sets has a through hole at each side thereof (to be hereinafter described) so that when the contact sets are positioned on the printed circuit board 43 the holes through the contact sets are aligned with the pattern of counterbored holes 41. Consequently, when a screw 46 is placed through each of the counterbored holes 41 and the described holes in the contact sets 44 to engage the threaded inserts 42 in the printed circuit board 43, the screws will hold the test socket base and contact sets in place on the board 43. The printed circuit board has an appropriate array of conductors 47 thereon to communicate the accessible contacts 12 on the semiconductor device 11 through the contact sets 44 to a semiconductor test device (not shown).

It may be seen by reference to FIG. 2 that when testing of the semiconductor device is completed, rotation of the "pick and place" tool 13 will cause the extended pins 16a and 16b to contact the incline surfaces 27 and 28 of latches 24 and 26, respectively, to rotate the latches 29 and 31 against the springs 32 and 33 until the lips 37 and 38 on the latches are removed from a position overlying the upper surface of the semiconductor carrier 17. As a result, with vacuum reapplied to the "pick and place" tool the semiconductor device 11 is engaged thereby again and the entire semiconductor package, carrier and "pick and place" tool may be raised out of the central opening 39 in the test socket base so that the semiconductor device may be transported to a subsequent desired position.

Referring to FIG. 5, one of the solderless flexible contact sets 44 is shown in elevation having upper contacts 48 and lower contacts 49. Each upper and lower contact has an independent conducting path 51 extending therebetween. The independent conducting paths 51 are surrounded by a layered array 52 which extends therealong to positions proximate to the upper and lower contacts 48 and 49. The layered array is contacted above and below by contact blocks or wedges 53 and 54, respectively, which have matching or parallel contact surfaces inclined to a lower surface 56 on the lower contact block 54. The inclined surfaces provide for an inclination in the contact set rising from the lower contacts 49 to the upper contacts 48 as best seen in FIG. 5. The lower surface 56 of the lower contact block 54 rests on the upper surface of the printed circuit board 43 and an upper surface 57 of the upper contact block 53 is contacted by the lower surface of the test socket base 23 in final assembly as seen in FIG. 2. As a result, a predetermined pattern of contact pads (not shown) connected to the ends of the conductor paths 47 on the printed circuit board 43 are contacted by the lower contacts 49 in the contact sets 44. The upper contacts 48 extend upwardly, as seen in FIG. 2, to contact individual ones of the accessible contacts 12 extending from the semiconductor device 11 at the portions 12c (FIG. 4) thereof. Consequently, a conducting path is provided from the accessible contacts of the semiconductor device 11 through shielded conducting paths 51 in the contact sets 44 to a semiconductor test circuit board through the printed circuit conducting paths 47.

The contact sets 44 have the upper and lower contact blocks or wedges 53 and 54 fixed thereto by means of cured epoxy which fills cavities 53a and 54a in the blocks as best seen in FIG. 5. The layered or shielding portion of the contact sets 44 is best seen in detail in FIG. 7. An upper and a lower 1.4 thousandths thick copper layer 58 is fastened by a thin adhesive layer 59 to an insulating layer 61, which is Kaption (TM) in the preferred embodiment. The Kapton (TM) layers 61 are attached by another thin layer of adhesive 62 to the conducting paths 51 between the upper contacts 48 and the lower contacts 49. The electrical shielding provided by layered array 52, as described in conjunction with FIG. 7, prevents radiated noise in the conducting paths 51 and controls the impedance of the contact sets 44 to a desired level for high frequency semiconductor device testing. Fifty ohms impedance is a commonly acceptable level in the application described herein. The upper and lower contact blocks 53 and 54 have aligned holes 63 therein which constitute the aforementioned holes through the contact sets or assemblies 44 which are aligned with the pattern of counterbored holes 41 in the test socket base 23.

With reference to FIG. 8 of the drawings, the conductor paths 47 leading from the pattern of pads (not shown) which are arranged in registration with the lower contacts 49 on the contact sets 44 are shown on the printed circuit board 43. A contact set positioning jig 64 is fixed temporarily on the printed circuit board 43 by means of a screw therethrough which enters a threaded hole 66 (FIG. 2) in the center of the printed circuit board. The positioning jig 64 is fashioned so that when the upper contacts 48 on the contact sets 44 are in contact with raised sides 67 thereon, the contact sets 44 are properly positioned for the upper contacts to receive the accessible contacts 12 on a semiconductor device 11 when it is placed within the test socket base 23 as hereinbefore described and for the lower contacts 49 to be placed in proper registration with the pattern of pads on the printed circuit board 43. Initially the lower contacts are placed on the board pattern of pads visually. The test socket base is screwed into place with the screws 46 passing through the counterbored holes 41 and the holes 63 in the contact sets with the contact set positioning jig 64 in place. Thereafter, the positioning jig 64 is removed and the semiconductor device test socket, including the contact sets, is ready for operation.

As may be noted in FIG. 5 of the drawings, the lower contacts 49 extend in a relaxed position below the surface 56 on the lower block 54. As a consequence, when the assembly of the contact sets 44 is made on the printed circuit board 43, the lower contacts 49 are tightly pressed into the pattern of conducting pads on the printed circuit board. The upper contacts 48 are also seen in FIG. 5 to extend in a relaxed position above the upper surface 57 of the upper block 53. A kerf is cut between each of the independent conducting paths 51 through the layered shielding assembly 52 along a length extending from the upper contacts 48 to the edge of the upper and lower contact blocks 53 and 54. This provides independent spring action "fingers" extending from the contact blocks upwardly to the upper contacts 48. This independent "finger" spring action is necessary because the upper contacts are subjected to repeated contact pressures by the insertion and removal of semiconductor devices 11. All of the portions 12c (FIG. 4) of the gull wing accessible contacts 12 on a semiconductor device may not be precisely in the same plane. Therefore some spring action in the upper contacts is necessary for solid contact pressure between each upper contact 48 and its respective gull wing contact 12 on a semiconductor device. The upper contacts 48 are in a pattern which is in registration with the pattern of gull wing contacts 12 on the particular semiconductor device under test. In this fashion upper and lower contacts on the contact sets 44 are placed in firm engagement with the registered semiconductor accessible contacts and the contact pads on the printed circuit board respectively.

Although the best mode contemplated for carrying out the present invention has been herein shown and described, it will be understood that modification and variation may be made without departing from what is regarded to be the subject matter of the invention. HMS:lu

What is claimed is:

1. A semiconductor test socket secured to a test board having a pattern of contact pads to communicate with a predetermined pattern of accessible contacts on a semiconductor device under test wherein the device under test is transported to the test socket by a semiconductor holder, comprising insulator carrier means adapted to be accepted by the semiconductor holder and to contain a semiconductor device therewithin, means on said insulator carrier means for mechanically supporting the predetermined pattern of accessible contacts on the semiconductor device, a test socket base for receiving said insulator carrier means, latching means on said test socket base for holding said insulator carrier means in place within said test socket base during testing and for thereafter releasing said insulator carrier means, and at least one unitary array of replaceable spring contacts disposed between said test socket base and the test board and having opposed upper and lower contact sides thereon, said lower contact side having a plurality of electrical contacts arranged in registration with the test board pattern of contact pads, and said upper contact side having a plurality of electrical contacts in electrical communication with ones of said lower contact side plurality of contacts and being arranged in registration with the predetermined pattern of accessible contacts on the semiconductor device under test.

2. A semiconductor test socket as in claim 1 wherein said upper contact side comprises, a plurality of dependently spring loaded conductor lengths.

3. A semiconductor test socket as in claim 1 wherein said at least one unitary array of replaceable spring contacts comprises an upper electrical shield, a lower electrical shield, a plurality of conductor paths providing said communication between said lower contact side plurality and said upper contact side plurality of contacts, and insulator means disposed between said upper electrical shield and said plurality of conductor paths and between said lower electrical shield and said plurality of conductor paths.

4. A semiconductor test socket as in claim 1 wherein said at least one unitary array of replaceable spring contacts comprises a plurality of conductor lengths, an upper electrical shield located on one side of said plurality of conductor lengths, a lower electrical shield located on an opposite side of said plurality of conductor lengths, insulation means disposed between said plurality of conductor lengths and both said upper and lower electrical shields, and holding means disposed adjacent said upper and lower electrical shields.

5. A semiconductor test socket as in claim 4 wherein said holding means comprises upper and lower holding blocks engaging said upper and lower electrical shields and having upper and lower planar surfaces thereon respectively, said upper and lower holding blocks being disposed to hold said contact means at an angle inclined to the test board to thereby firmly engage the contact pads with said lower contact side and the pattern of semiconductor accessible contacts with said upper contact side.

6. A semiconductor test socket as in claim 5 wherein said angle inclined to the test board is substantially five degrees.

7. A semiconductor test socket apparatus for attachment to a semiconductor test board for use in testing a semiconductor device having a predetermined pattern of accessible device terminals, comprising a pattern of test contact pads formed on the semiconductor test board, a test socket base disposed above said pattern of contact pads, semiconductor device positioning means for containing the semiconductor device therewithin and for locating the semiconductor device in said test socket base, at least one unitary array of replaceable spring contacts positioned between said test socket base and the semiconductor test board having a plurality of solderless lower contacts arranged in registration with said pattern of test contact pads and having a plurality of solderless upper contacts in electrical communication with ones of said plurality of lower contacts, said plurality of solderless upper contacts being arranged in registration with the predetermined pattern of accessible semiconductor device terminals, and means for fixing said test socket base and said at least one unitary array of replaceable spring contacts to the semiconductor test board.

8. Apparatus as in claim 7 comprising latching means attached to said test socket base, said latching means being movable between a latched position for securing said semiconductor device positioning means in said test socket base and an unlatched position for allowing said semiconductor device positioning means to be removed therefrom.

9. Apparatus as in claim 7 wherein said semiconductor device positioning means comprises insulator means, and means for supporting the accessible device terminals on the side thereof opposite the side contacted by said plurality of upper contacts, whereby the accessible device terminals are not moved beyond their elastic limit by said upper contacts.

* * * * *

UNITED STATES PATENT AND TRADEMARK OFFICE
CERTIFICATE OF CORRECTION

PATENT NO. : 5,557,212
DATED : Sept. 17, 1996
INVENTOR(S) : George L. Isaac, et al It is certified that error appears in the above-identified patent and that said Letters Patent is hereby corrected as shown below:

Column 6, claim 2, line 3, delete "dependently" and insert —independently—

Signed and Sealed this

Twenty-fourth Day of February, 1998

Attest:

BRUCE LEHMAN

*Attesting Officer*  *Commissioner of Patents and Trademarks*